(12) United States Patent
Hirosaki et al.

(10) Patent No.: US 8,148,887 B2
(45) Date of Patent: *Apr. 3, 2012

(54) LIGHT EMITTING DIODE LAMP AND LIGHT EMITTING DEVICE

(75) Inventors: Naoto Hirosaki, Tsukuba (JP); Ken Sakuma, Tsukuba (JP); Kyota Ueda, Tsukuba (JP); Hajime Yamamoto, Tsukuba (JP)

(73) Assignee: National Institute for Materials Science, Tsukuba-shi, Ibaraki (JP)

( * ) Notice: Subject to any disclaimer, the term of this patent is extended or adjusted under 35 U.S.C. 154(b) by 639 days.

This patent is subject to a terminal disclaimer.

(21) Appl. No.: 12/222,408

(22) Filed: Aug. 8, 2008

(65) Prior Publication Data
US 2009/0167153 A1     Jul. 2, 2009

Related U.S. Application Data

(63) Continuation of application No. 10/588,007, filed as application No. PCT/JP2005/002675 on Feb. 15, 2005, now Pat. No. 7,573,190.

(30) Foreign Application Priority Data

Feb. 18, 2004   (JP) ................................ 2004-041502

(51) Int. Cl.
    *H01J 1/62*     (2006.01)
(52) U.S. Cl. ......................................... 313/486; 362/84
(58) Field of Classification Search .......... 313/484–487,
    313/489, 498, 512, 467, 468, 499, 501–503;
    362/235, 227, 231, 293, 545, 555, 800; 257/98,
    257/99, 100, 80, 79, 783; 345/44, 46, 80
    See application file for complete search history.

(56) References Cited

U.S. PATENT DOCUMENTS

| | | | |
|---|---|---|---|
| 6,632,379 B2 | 10/2003 | Mitomo et al. | |
| 6,674,233 B2 | 1/2004 | Ellens et al. | |
| 6,682,663 B2 | 1/2004 | Botty et al. | |
| 6,717,355 B2 | 4/2004 | Takahashi et al. | |
| 6,724,142 B2 | 4/2004 | Ellens et al. | |
| 6,776,927 B2 | 8/2004 | Mitomo et al. | |
| 6,891,200 B2 * | 5/2005 | Nagai et al. | 257/88 |
| 7,253,446 B2 * | 8/2007 | Sakuma et al. | 257/98 |
| 7,258,816 B2 * | 8/2007 | Tamaki et al. | 252/301.4 F |
| 7,544,310 B2 * | 6/2009 | Hirosaki | 252/301.4 F |
| 7,554,129 B2 * | 6/2009 | Roth et al. | 257/100 |
| 7,573,190 B2 * | 8/2009 | Hirosaki et al. | 313/503 |

(Continued)

FOREIGN PATENT DOCUMENTS

JP         2002-171000       6/2002

(Continued)

OTHER PUBLICATIONS

Machine Translation of JP 2005109085 A.*

(Continued)

*Primary Examiner* — Peter Macchiarolo
(74) *Attorney, Agent, or Firm* — Manabu Kanesaka

(57) ABSTRACT

A bullet type light emitting diode lamp or a chip-type light emitting diode lamp includes a semiconductor light emitting element, and a plurality of fluorescent materials that absorb part or whole of light emitted from the semiconductor light emitting element, and emit fluorescence at a wavelength different from that of the absorbed light. The fluorescent materials include a phosphor of a $CaAlSiN_3$ crystalline phase.

11 Claims, 9 Drawing Sheets

Bullet type light emitting diode lamp of embodiment 1

U.S. PATENT DOCUMENTS

| | | | |
|---|---|---|---|
| 7,678,294 B2 * | 3/2010 | Hirosaki | 252/301.4 F |
| 7,947,198 B2 * | 5/2011 | Hirosaki | 252/301.4 F |
| 2003/0030038 A1 | 2/2003 | Mitomo et al. | |
| 2003/0030368 A1 | 2/2003 | Ellens et al. | |
| 2003/0094893 A1 | 5/2003 | Ellens et al. | |
| 2004/0135504 A1 | 7/2004 | Tamaki et al. | |
| 2005/0189863 A1 | 9/2005 | Nagatomi et al. | |
| 2006/0006782 A1 | 1/2006 | Nagatomi et al. | |
| 2006/0017365 A1 | 1/2006 | Nagatomi et al. | |
| 2006/0022573 A1 | 2/2006 | Gotoh et al. | |
| 2006/0033083 A1 | 2/2006 | Sakane et al. | |
| 2006/0038477 A1 | 2/2006 | Tamaki et al. | |
| 2006/0043337 A1 | 3/2006 | Sakane et al. | |
| 2006/0045832 A1 | 3/2006 | Nagatomi et al. | |
| 2006/0065878 A1 | 3/2006 | Sakane et al. | |
| 2006/0076883 A1 | 4/2006 | Himaki et al. | |
| 2006/0091790 A1 | 5/2006 | Nagatomi et al. | |
| 2006/0192178 A1 | 8/2006 | Hirosaki | |
| 2006/0197432 A1 | 9/2006 | Nagatomi et al. | |
| 2007/0007494 A1 | 1/2007 | Hirosaki et al. | |
| 2007/0029525 A1 | 2/2007 | Gotoh et al. | |

FOREIGN PATENT DOCUMENTS

| | | | |
|---|---|---|---|
| JP | 2002-322474 | | 11/2002 |
| JP | 2003-168305 | | 6/2003 |
| JP | 2003-277746 | | 10/2003 |
| JP | 2003-321675 | | 11/2003 |
| JP | 2003-336059 | | 11/2003 |
| JP | 2004-010786 | | 1/2004 |
| JP | 2004-67837 | | 3/2004 |
| JP | 2004-182780 | | 7/2004 |
| JP | 2004-182781 | | 7/2004 |
| JP | 2004-189996 | | 7/2004 |
| JP | 2004-277663 | | 10/2004 |
| JP | 2005-8793 | | 1/2005 |
| JP | 2005-8794 | | 1/2005 |
| JP | 2005109085 A | * | 4/2005 |
| JP | 2006-028295 | | 2/2006 |
| JP | 2006-063286 | | 3/2006 |
| JP | 2006-070109 | | 3/2006 |
| JP | 2011017004 A | * | 1/2011 |
| WO | WO 2005/103199 | | 11/2005 |

OTHER PUBLICATIONS

"Success in Development of Red Phosphor for White LED" Beacon of new era; Aug. 31, 2004, National Institute for Materials Science.

"The Crystal Structure and Photoluminescence Properties of a New Red Phosphor, Calcium Aluminum Silicon Nitride Deped With Divalent Europium"; K. Uheda et al.; School of Bionics, Tokyo University of Technology; Advanced Materials Laboratory National Institute for Materials Science (NIMS); Center for Interdisciplinary Research, Tohoku University; and Institute of Multidisciplinary Research for Advanced Materials, Tohoku University; The Electrochemical Society.

"Nitride Phosphor-Related Presentation" Japan Society of Applied Physics, Sep. 2, 2004.

Zhan-Kun Huang, et al., "Phase relations of the $Si_3N_4$-AlN-CaO system", Journal of Materials Science Letter 4, 1985, p. 255-259.

H.A. Hoeppe, t al. Luminescence in $Eu^{2+}$-doped $Ba_2Si_5N_8$: fluorescence, thermoluminescence, and upconversion; Journal of Physics and Chemistry of Solids 61; 2000; pp. 2001-2006.

J.W.H. van Krevel "On new rare-earth doped M-Si-Al-O-N materials"; TU Eindhoven; 2000; pp. 1-173.

* cited by examiner

Bullet type light emitting diode lamp of embodiment 1

Chip-type light emitting diode lamp of embodiment 2

Lighting apparatus of embodiment 3

US 8,148,887 B2

LIGHT EMITTING DIODE LAMP AND LIGHT EMITTING DEVICE

TECHNICAL FIELD

The present invention relates to a high-luminance white light emitting diode lamp, an intermediate color light emitting diode lamp, and a light emitting device utilizing nitride phosphor.

BACKGROUND ART

White light emitting diodes have been recently and extensively investigated by combining a blue light emitting diode element and a blue-light absorbing/yellow-light emitting phosphor. Examples of these have been proposed and presented in various literature including patent-related references (see patent-unrelated reference 1, and patent-related references 1 through 5, for example). Recently, lighting instruments, lighting equipments, and lighting apparatuses based on the aforementioned combination have been put into practical use.

An example of a phosphor frequently used in the above applications, is a yttrium/aluminum/garnet based phosphor activated by cerium, represented by a general formula $(Y, Gd)_3(Al, Ga)_5O_{12}:Ce^{3+}$. However, the white light emitting diode comprising a blue light emitting diode element and a yttrium/aluminum/garnet based phosphor tends to emit bluish white light due to lack of a red component, thereby problematically exhibiting deviation in a color rendering property.

Meanwhile, lighting techniques have been diversified in usages, usage schemes, and needs, thereby demanding diversified color tone designs including realization of not only white color having a higher color temperature in the aforementioned lighting techniques utilizing light emitting diodes, but also white colors having various color temperatures such as seen in conventional ordinary lighting instruments, respectively. For example, there has been a need for a white light emitting diode for achieving a white color which provides warmness and is referred to as an "incandescent color". Under such circumstances, there has been research into a white light emitting diode including two kinds of mixed and dispersed phosphors, such that a red component lacking in case of a yttrium/aluminum/garnet based phosphor, is compensated for by an additional red phosphor.

Such a white light emitting diode has been proposed in a patent-related reference 4 ("white light emitting element"), a patent-related reference 5 ("nitride phosphor and production method thereof"), and the like. However, the above-described problem has not been fully solved even by such research, which deviates from a situation where the needs for diversified color schemes and chromaticities are fully dealt with, while such proposals are also insufficient in emission intensity, thereby still exhibiting a problem to be solved. Namely, the arrangement described in the patent-related reference 4 exhibits a problem in that a red phosphor used therein contains Cd, i.e., cadmium. However, it has been recently proposed to eliminate cadmium and cadmium-including compounds from usage, based on environmental pollution concerns, and to alternatively use substances free of cadmium. It is thus desirable to design of fluorescent materials in view of the above consideration.

Further, red-light emitting phosphors described in a patent-related reference 5 and exemplarily represented by $Ca_{1.97}Si_5N_8:Eu_{0.03}$, are not problematic in that the phosphors include no elements like cadmium which are a concern with respect to environmental pollution, but are insufficient in emission intensity, so that further improvement is still desired. Moreover, the technical concepts described in the patent-related references 4 and 5 have merely and exclusively referred to realization of white color. Lighting techniques are diversified in usage as mentioned above, and decorative effects are also demanded. Thus, diversified color tones and tints are demanded, thereby in turn demanding various light sources for preparing and realizing color tones therefor. Namely, such needs have not been satisfied by white light emitting diodes only, so that there has been the desired realization of light emitting diodes of various intermediate colors. Additionally, it has been also desired to extend a chromaticity range as wide as possible from a desired color tone so as to attain a sufficient color tone expression.

[Patent-unrelated reference 1] M. Yamada et al, Jpn. J. Appl. Phys., vol. 42 (2003), pp. L20-23
[Patent-related reference 1] JP-2900928
[Patent-related reference 2] JP-2927279
[Patent-related reference 3] JP-3364229
[Patent-related reference 4] JP-A-10-163535
[Patent-related reference 5] JP-A-2003-321675

SUMMARY OF THE INVENTION

The above-described related art are disadvantageously lacking in diversified color tones, chromaticities, light emitting intensities, and the like, and are disadvantageous due to adverse effects to the environment, and it is thus an object of the present invention to provide light emitting diodes free of such problems, white light emitting diodes for emitting white light with warmness, and intermediate color light emitting diodes satisfying light emission in diversified color tones. In more detail, it is an object of the present invention to provide a white light emitting diode for emitting white light with warmness at a higher efficiency, by designing a material for a novel red phosphor comprising components free of possible environmental pollution and having a higher light-emission efficiency, and by combining these components with a blue light emitting diode. It is a further object of the present invention to provide an intermediate color light emitting diode for enabling arbitrary selection of a light emission color from among a wider chromaticity range.

To achieve the above objects, the present inventors have investigated and consequently succeeded in fabricating a white light emitting diode for emitting white light with warmness at a higher efficiency, and a diode for emitting light in a color tone arbitrarily selectable from among a wide chromaticity range such as a so-called intermediate color light emitting diode, by: adopting a phosphor according to Japanese patent application (No. 2003-394855) previously filed by the present inventors, i.e., a fluorescent material for emitting yellowish red light or red light, which comprises a $CaAlSiN_3$ crystal phase ($CaAlSiN_3$ crystalline) including, dissolved therein in a solid state, one kind or two or more kinds of element(s) selected from Mn, Ce, Pr, Nd, Sm, Eu, Gd, Tb, Dy, Ho, Er, Tm, Yb, and Lu; mixing, into the phosphor, a fluorescent material at a predetermined ratio which emits green, yellowish green or yellow light; and combining a semiconductor light emitting element for emitting bluish purple or blue light, with the mixedly obtained phosphor, in a manner to actually mount the phosphor near the semiconductor element so as to energize the semiconductor light emitting element to thereby emit light.

The present invention has been carried out based on the above success and knowledge, and the technical matters taken therein will be described in the following items (1) through (9), thereby succeeding in solving the above problems.

(1) A bullet type light emitting diode lamp or a chip-type light emitting diode lamp to be mounted on a substrate, at least including a semiconductor light emitting element, and a plurality of fluorescent materials that absorb part or whole of light emitted from the semiconductor light emitting element, and emit fluorescence at a wavelength different from that of the absorbed light, wherein the plurality of fluorescent materials comprise a phosphor mainly composed of a $CaAlSiN_3$ crystal phase as the fluorescent materials.

(2) The bullet type light emitting diode lamp or the chip-type light emitting diode lamp to be mounted on a substrate according to item (1), wherein the phosphor has a main emission wavelength of 585 nm to 780 nm, and emits light in a range of "red" by a general chromaticity classification, according to system color names of JIS Z8110.

(3) The bullet type light emitting diode lamp or the chip-type light emitting diode lamp to be mounted on a substrate according to item (1), wherein the bullet type light emitting diode lamp or the chip-type light emitting diode lamp to be mounted on a substrate emits light in a color of a chromaticity coordinate of x=0.34 to 0.38 and y=0.32 to 0.42 in a chromaticity diagram (CIE) of an XYZ colorimetric system according to JIS Z8701.

(4) A visible light emitting device, at least including a semiconductor light emitting element that emits bluish purple or blue light, a support member for placing the semiconductor light emitting element therein, a terminal for supplying electric power to the semiconductor light emitting element, and a fluorescent material that absorbs part or whole of light emitted from the semiconductor light emitting element, and emits fluorescence at a wavelength different from that of the absorbed light, wherein the fluorescent material includes a nitride phosphor that is obtained by firing using an electric furnace of a resistance heating type.

(5) The light emitting device according to item (4), wherein the nitride phosphor is obtained by heating after firing atmosphere is made vacuum.

(6) The light emitting device according to item (4), wherein the nitride phosphor is obtained by firing using a crucible made of boron nitride.

(7) The light emitting device according to item (4), wherein the nitride phosphor is obtained by pulverizing after firing in nitride atmosphere.

(8) The light emitting device according to item (4), wherein the nitride phosphor has a main emission wavelength of 585 nm to 780 nm, and emits light in a range of "red" by a general chromaticity classification, according to system color names of JIS Z8110.

(9) The light emitting device according to item (4), wherein the nitride phosphor is a phosphor that is mainly composed of a $CaAlSiN_3$ crystal phase.

The above feature resides in adoption of a fluorescent material which is configured to emit yellowish red or red light and which mainly composed of a $CaAlSiN_3$ crystal phase, in a manner that the fluorescent material is mixed with another fluorescent material configured to emit green, yellowish green, or yellow light, and that the mixedly obtained phosphor is combined with a semiconductor light emitting element configured to emit bluish purple or blue light, thereby succeeding in fabricating a white light emitting diode for emitting white light with warmness at a high efficiency, with an extremely remarkable effect.

Further, the present invention enables arbitrary color tones by virtue of the above configuration, and thus has succeeded in providing an intermediate color light emitting diode configured to emit intermediate color light, with an extremely remarkable significance. In this way, the present invention exhibits an exceptional effect such as the achievement of a light emitting diode which has a wider chromaticity range and which is excellent in color rendering property as compared with a situation of adoption of the conventionally known red phosphor, so that the present invention is expected to be widely utilized in various usages including decorative usage from now on in a manner to largely contribute to development of the industry through the lighting technique.

Moreover, the light emitting diode of the present invention has a high light-emission efficiency, and it is thus expected that the same directly realizes an energy-saving lighting instrument to thereby exhibit an exceptional effect.

DESCRIPTION OF THE PREFERRED EMBODIMENTS

The present invention will be concretely described, based on the drawings, embodiments, and the like. In the present specification, the "second fluorescent material which emits yellowish red or red light" or the second fluorescent material "which comprises a $CaAlSiN_3$ crystal phase including, dissolved therein in a solid state, one kind or two or more kinds of element(s) selected from Mn, Ce, Pr, Nd, Sm, Eu, Gd, Tb, Dy, Ho, Er, Tm, Yb, and Lu", are those developed by the present inventors and have been already disclosed in a Japanese patent application (No. 2003-394855). Namely, although the second fluorescent material "which emits yellowish red or red light" or "which comprises a $CaAlSiN_3$ crystal phase including, dissolved therein in a solid state, one kind or two or more kinds of element(s) selected from Mn, Ce, Pr, Nd, Sm, Eu, Gd, Tb, Dy, Ho, Er, Tm, Yb, and Lu" has been disclosed concerning its easy availability by disclosing its production method in the above-described Japanese patent application, the aspects of a production method and a preparation method will be also disclosed concretely in the embodiments to be described later in the present specification in a readily available manner, similarly to the above mentioned Japanese patent application.

Although the present invention will be concretely described based on embodiments and drawings, these embodiments are merely shown to aid in readily understanding the present invention, without limiting the present invention thereto.

Figure 4:
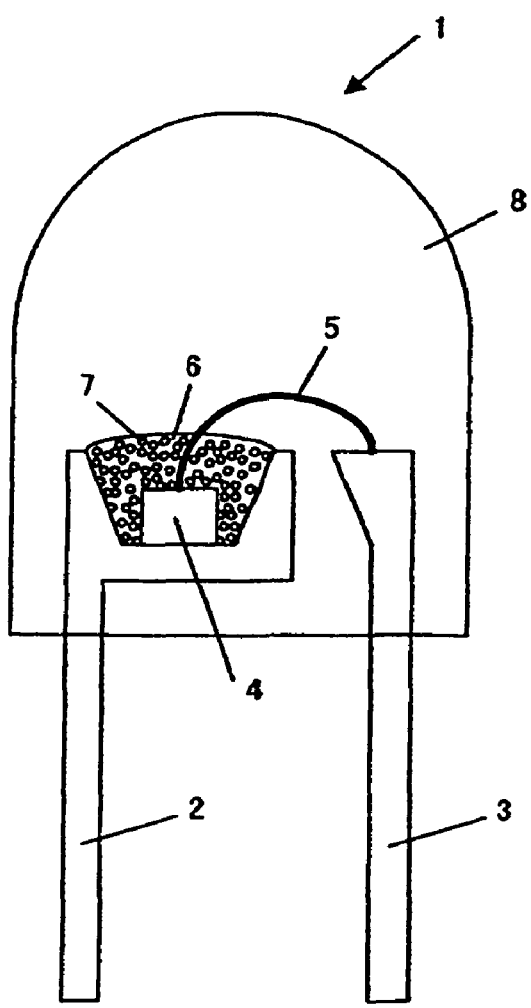
FIG. 4 is a schematic view of a first embodiment mounted as a bullet-type light emitting diode lamp.

There will be firstly and briefly described a structure and an operating principle of a light emitting diode lamp of the present invention. There is firstly prepared a blue light emitting semiconductor diode element; the light emitting semiconductor diode element is placed on a support member having a concave structure as schematically shown in FIG. 4; at least two electroconduction paths are connected to the diode element, so as to supply electric power thereto from the exterior; and the diode element is coated, from the above, with a first phosphor and a second phosphor which are dispersed in a transparent resin and mounted on the diode element in a manner to absorb the light emitted from the blue light emitting diode element and to emit fluorescences at wavelengths different from each other such as green and red in color, respectively. The light emitting diode lamp shown in FIG. 4 is called a bullet type, based on its external appearance shape.

Figure 1:
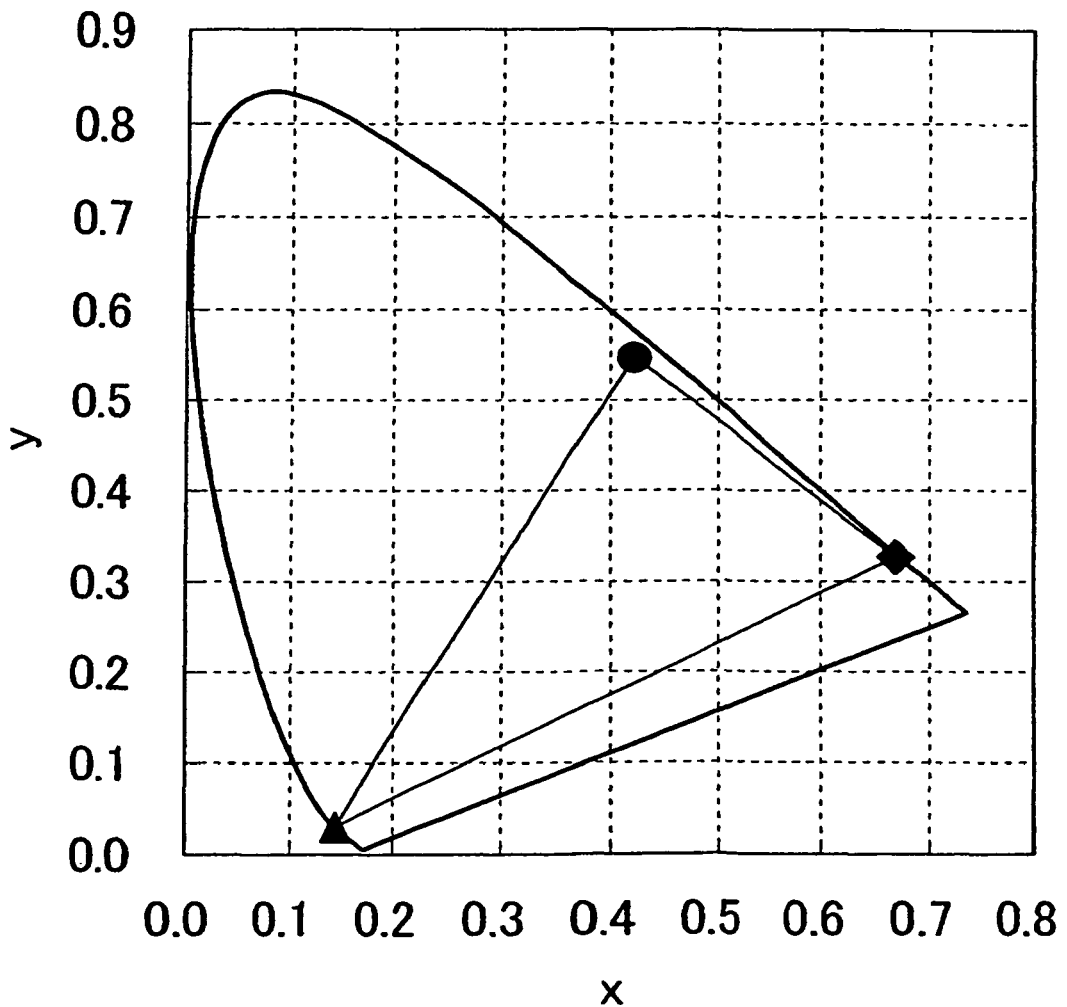
FIG. 1 is a chromaticity diagram (CIE) of XYZ colorimetric system in conformity to JIS Z8701 and a chromaticity range of the present invention.

FIG. 1 is a chromaticity diagram (see JIS Z8701) of XYZ colorimetric system of CIE, showing an emission spectrum when the light emitting diode lamp fabricated above is energized to emit light. In this graph, the point B (filled triangle) represents chromaticity coordinates of light emission of the blue light emitting diode element. The point G (filled circle) represents chromaticity coordinates of the first fluorescent material which is excited by blue light to emit green light. The point R (filled square) represents chromaticity coordinates of the second fluorescent material which is excited by blue light to emit red light. Relatedly, while the patent-related reference 4 has disclosed a technique for obtaining white light in a range where coordinates (x, y) are $0.21 \leq x \leq 0.48$ and $0.19 \leq y \leq 0.45$ by virtue of mixture of such blue, green, and red light, it is actually possible by the technique of the patent-related reference 4 to obtain light emission in an arbitrary intermediate color inside a triangle to be defined by connecting the three coordinate points B, G, and R.

Figure 2:
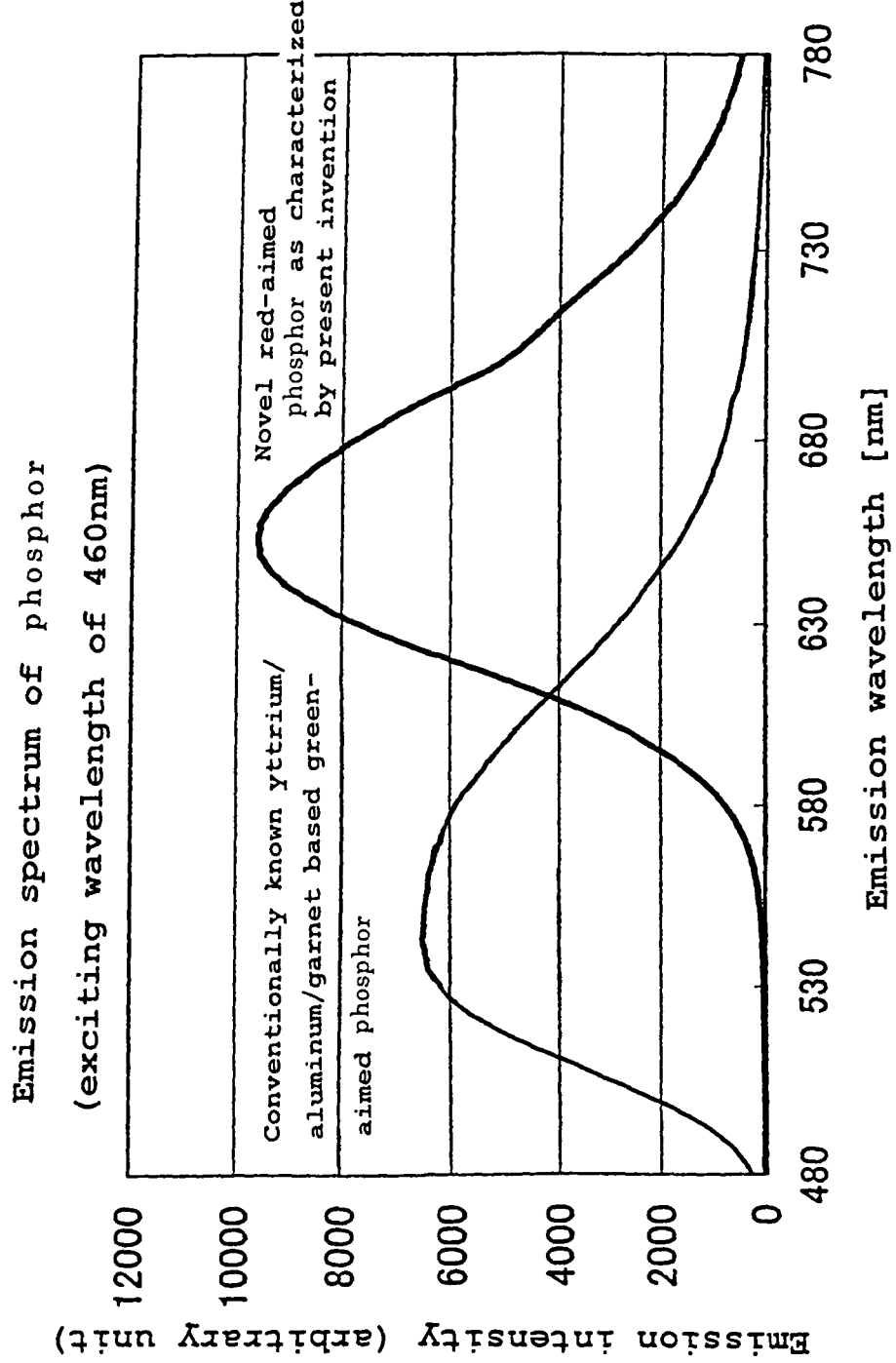
FIG. 2 is a graph of emission spectra of a first phosphor and a second phosphor as measured by a spectrophotofluorometer (exciting wavelength is 460 nm identically to a blue light emitting diode element used in embodiments).
Figure 3:
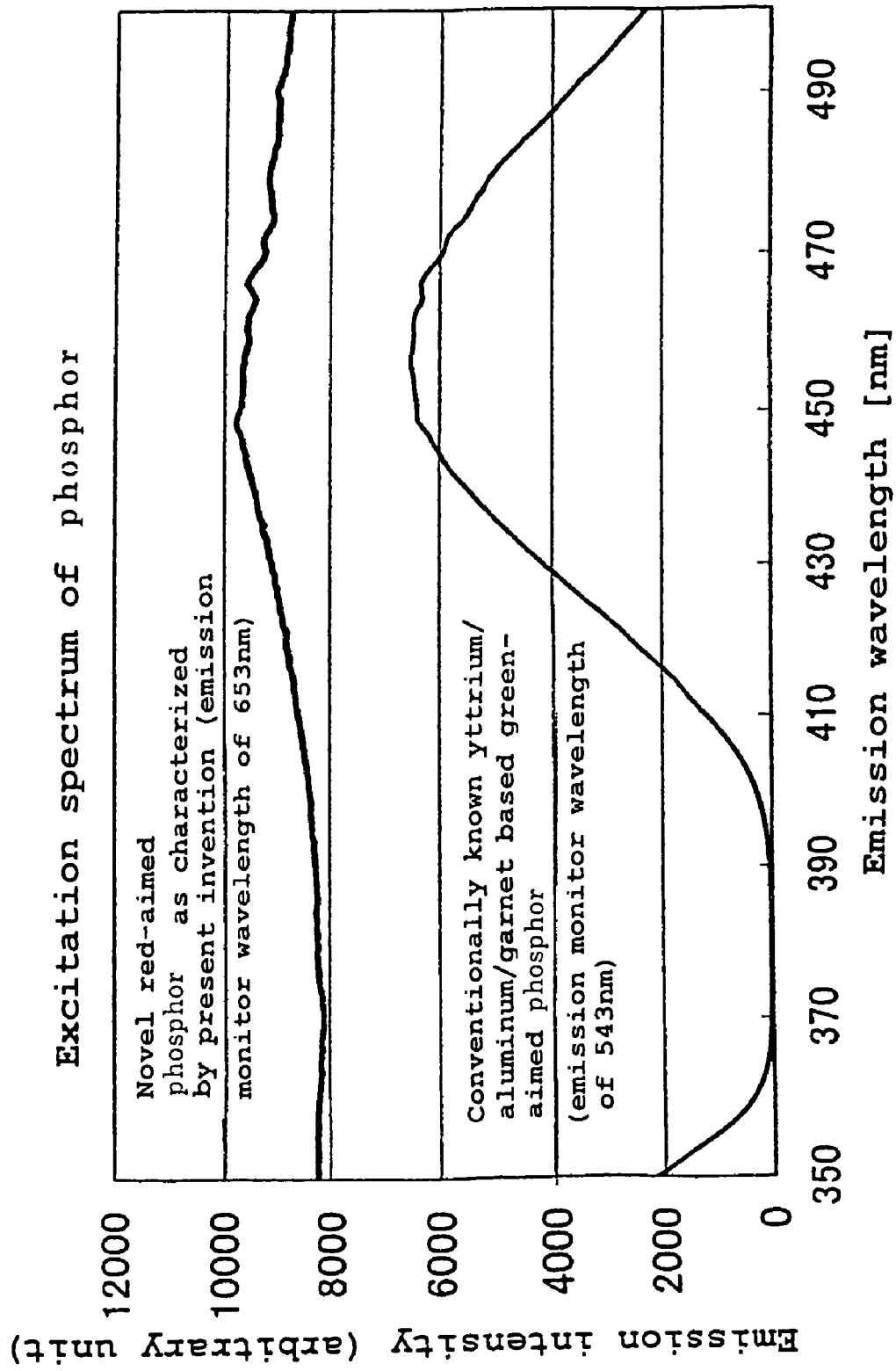
FIG. 3 is a graph of excitation spectra of the first phosphor and the second phosphor as measured by a spectrophotofluorometer (emission monitor wavelengths are 543 nm and 653 nm which are light emission peak wavelengths of the phosphors, respectively).

According to the present invention, it is possible to achieve a light emitting diode capable of emitting light in various white colors and diversified intermediate colors, based on the principle explained with respect to the above emission spectrum. Note that the feature of the present invention substantially resides in that a novel material is adopted as the second fluorescent material thereby enabling light emission with high luminance. The second fluorescent material is derived from the previous Japanese patent application (No. 2003-394855) based on the invention of the present inventors, and is a novel fluorescent material comprising $CaAlSiN_3$ crystal activated by Eu. The novel second fluorescent material exhibits a higher luminance as compared with a conventionally well-known blue-light excited/red light emitting fluorescent material, and is a material exhibiting light emission at longer wavelengths. Emission spectra and excitation spectra of them are shown in FIG. 2 and FIG. 3, respectively.

In realizing an arbitrary intermediate color by mixing blue, green, and red, explanation is conducted by using a general chromaticity classification of system color names according to JIS Z8110. Desirable for blue are light sources which are in a range of bluish purple or blue in color. In case of adoption of a monochromatic light source, its wavelength range is to be 380 nm to 485 nm. Although shorter wavelengths seem to be desirable from a standpoint of enlarging an area of the triangle so as to widen an achievable chromaticity range, longer wavelengths are actually and rather felt to be brighter by people from a point of relative visibility property, so that wavelengths are to be determined in consideration of it as well.

In embodiments to be described later, there is adopted a blue light emitting diode element having an emission center wavelength of 460 nm, from among commercially and readily available ones. In turn, although desirable for green are fluorescent materials within a wavelength range of 495 nm to 550 nm, fluorescent materials for emission of yellowish green or yellow light within a wavelength range of 550 nm to 585 nm will do in an embodiment which aims at realizing, not arbitrary intermediate colors, but white light with warmness only. In the embodiments to be described later, there is adopted a conventionally known yttrium/aluminum/garnet based phosphor powder.

Concerning red, although fluorescent materials are desirable which emit within a wavelength range of 610 nm to 780 nm for red, those may also be adopted for yellowish red color in a wavelength range of 585 nm to 610 nm. In the present invention, adopted as a red phosphor, is a phosphor powder (the method for obtaining it will be clarified in the embodiments to be described later) comprising a novel substance of $CaAlSiN_3$ crystal activated by Eu. Conventionally, there are no red fluorescent materials, which exhibit sufficient luminance by blue light excitation.

In the patent-related reference 4, chromaticity coordinates represented by R in FIG. 1 correspond to yellowish red or to a chromaticity near a boundary between yellowish red and red. Further, the patent-related reference 5 includes its embodiment 1, for example, having chromaticity coordinates of x=0.583 and y=0.406 which also correspond to yellowish red. Contrary, the embodiments of the present invention each include a $CaAlSiN_3$ crystal activated by Eu, which has a higher luminance and exhibits emission chromaticity of red by virtue of emission at a longer wavelength which is conventionally absent, and such an emission chromaticity corresponds to chromaticity coordinates of x=0.670 and y=0.327.

The white light emitting diode with warmness of the present invention fabricated by adopting such a fluorescent material, has a higher luminance as compared with one fabricated by the related art. Further, the intermediate color light emitting diode of the present invention fabricated by adopting such a fluorescent material, has a higher luminance and a widened range of expressible chromaticity, as compared with one fabricated by the related art. In this way, the present invention is apparently novel and inventive. Note that it is possible to mix three or more kinds of fluorescent materials, for an improved color rendering property.

The present invention will be concretely described, based on embodiments.

There have been prepared phosphors for three colors basically required for designing a white color diode, i.e., red phosphor, green phosphor, and blue phosphor.

[Preparation of Red Phosphor]

Firstly, used as a red phosphor was a nitride phosphor powder described in and according to the previous Japanese patent application (No. 2003-394855) and mainly including $CaAlSiN_3$ crystal phase. The preparation method was as follows. Used as a starting material powder were: a silicon nitride powder having an averaged particle size of 0.5 μm, an oxygen content of 0.93 wt %, and an α-type content of 92%; an aluminum nitride powder having a specific surface area of 3.3 m²/g and an oxygen content of 0.79%; a calcium nitride powder; and europium nitride synthesized by nitriding metal europium in ammonia. To obtain a composition represented by a composition formula $Eu_{0.0005}Ca_{0.9995}AlSiN_3$, there were weighed 34.0735 wt % of the silicon nitride powder, 29.8705 wt % of the aluminum nitride powder, 35.9956 wt % of the calcium nitride powder, and 0.06048 wt % of the europium nitride powder; these powders were mixed for 30 minutes by agate mortar and pestle; and the thus obtained mixture was molded by a metal mold by applying thereto a pressure of 20 Mpa, into a molded body having a diameter of 12 mm and a thickness of 5 mm.

Note that all steps of weighing, mixing, and molding the powders were operatively conducted within a glove box capable of maintaining a nitrogen environment including a moisture of 1 ppm or less and oxygen of 1 ppm or less. The molded body was placed in a crucible made of boron nitride, and set in a graphite resistance heating type of electric furnace. There was conducted a sintering operation in a manner to firstly bring a sintering atmosphere to vacuum by a diffusion pump, to heat the molded body from a room temperature up to 800° C. at a rate of 500° C./hour, to introduce, at 800° C., nitrogen at a purity of 99.999 vol % to thereby establish a pressure of 1 Mpa, and to elevate the temperature up to 1,800° C. at a rate of 500° C./hour, followed by holding for two hours at 1,800° C. After sintering, the obtained sintered body was pulverized by agate pestle and mortar into a powder, and there was conducted X-ray diffraction measurement of the powder by using Ka line of Cu, thereby confirming that it was a $CaAlSiN_3$ crystal phase, based on the obtained chart. This powder was measured by a spectrophotofluorometer F-4500 manufactured by Hitachi, Ltd., thereby obtaining an emission spectrum shown in FIG. 2 and an excitation spectrum shown in FIG. 3.

The photometer was calibrated by performing excitation correction with rhodamine B as a reference specimen, and then using a standard light source in conformity to NIST in U.S. In measuring an emission spectrum, there was adopted an exciting wavelength of 460 nm which was the same as the emission center wavelength of the blue light emitting diode element used in the embodiments. The emission spectrum was broad having an emission peak wavelength of 653 nm as shown in FIG. 2. Obtained from the emission spectrum of FIG. 2 were chromaticity coordinates of x=0.670 and y=0.327, on a chromaticity diagram of XYZ colorimetric system of CIE, and its main wavelength (dominant wavelength) was 612 nm. This is in a range of "red" by a general chromaticity classification, according to system color names in annexed FIG. 1 of JIS Z8110.

As apparent from comparison with an emission spectrum of a conventionally known yttrium/aluminum/garnet based phosphor in FIG. 2, the red phosphor comprising the $CaAlSiN_3$ crystal phase including Eu dissolved therein in a solid state, exhibited such red light emission with a higher luminance by excitation of blue light at a wavelength of 460 nm, which has not been realized up to now. The excitation spectrum of FIG. 3 was measured by using an emission monitor wavelength of 653 nm corresponding to an emission peak wavelength. It is seen that excitation can be achieved with a high efficiency over a very wide range centered near 460 nm.

[Preparation of Green Phosphor]

There was used a conventionally known yttrium/aluminum/garnet based phosphor, which was commercially available as a green phosphor for CRT. FIG. 2 shows an emission spectrum and FIG. 3 shows an excitation spectrum, respectively, measured by the calibrated F-4500. The emission spectrum was measured at an exciting wavelength of 460 nm, and was so broad having an emission peak wavelength of 543 nm. Chromaticity coordinates obtained from the emission spectrum of FIG. 2 were x=0.422 and y=0.547, and the main wavelength was 563 nm. This is in a range of "yellowish green" by the general chromaticity classification, according to the system color names. The excitation spectrum of FIG. 3 was measured by using an emission monitor wavelength of 543 nm corresponding to an emission peak wavelength. Note that the green phosphor is not limited to this one, insofar as adapted to be excited by blue light and to emit light in any one of green, yellowish green, and yellow.

[Preparation of Blue Light Emitting Element]

Adopted as a blue light emitting element was a commercially available blue light emitting diode element having an emission center wavelength of 460 nm. Used here was a light emitting semiconductor diode element made of InGaN, comprising a substrate made of silicon carbide having electrodes on both sides, respectively. Note that the blue light emitting element may be a light emitting diode element comprising a substrate made of sapphire having two electrodes on one side. Further, it may be a light emitting element other than a light emitting diode, insofar as capable of emitting blue light to thereby excite each phosphor.

After the above preparation, the white light emitting diode of the present invention will be concretely described based on its design structure and fabrication process.

Embodiment 1

There was fabricated a so-called bullet-type white light emitting diode lamp (1) shown in FIG. 4.

It included two lead wires (2, 3), one (2) of which had a depression having a blue light emitting diode element (4) placed therein. The blue light emitting diode element (4) had a lower electrode electrically connected to a bottom surface of the depression by an electroconductive paste, and an upper electrode electrically connected to the other lead wire (3) via thin gold line (5). Mounted near the light emitting diode element (4) was a phosphor (7) which was obtained by mixing a first phosphor and a second phosphor and which was dispersed in a resin. The phosphors were dispersed in a first resin (6) which was transparent and which covered the whole of the blue light emitting diode element (4). Encapsulated in a second transparent resin (8) were the tip end of the lead wire including the depression, the blue light emitting diode element, and the first resin including the phosphors dispersed therein. The second transparent resin (8) was in a substantially column shape as a whole, and had a tip end portion of a curved surface in a lens shape, which is typically called a bullet type.

Figure 5:
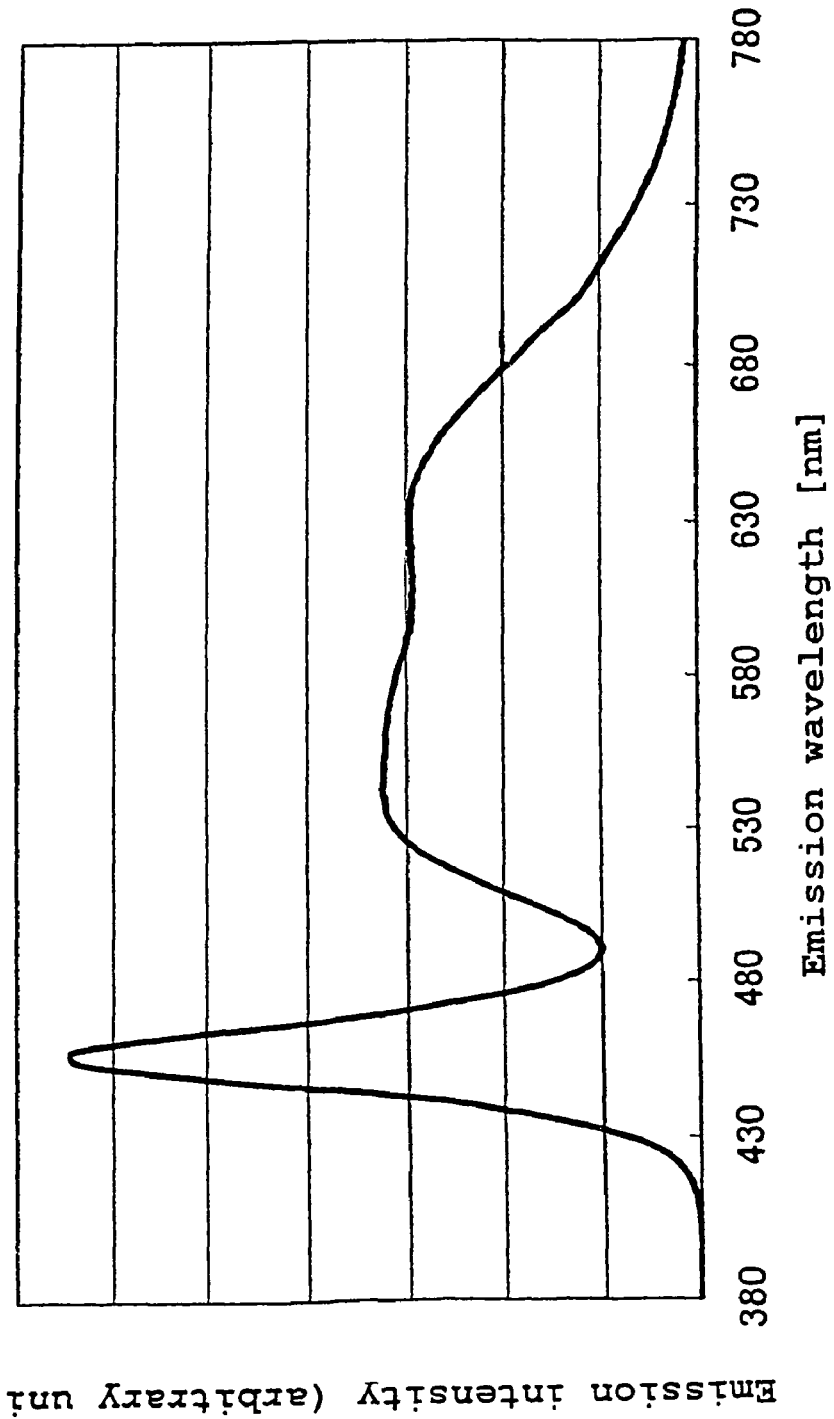
FIG. 5 is a graph of an emission spectrum of the light emitting diode of the first embodiment.

In this embodiment, the mixing ratio between the first phosphor powder and second phosphor powder was set to be 5:2, this mixed powder was blended into an epoxy resin at a concentration of 35 wt %, and the resultant resin was dropped at an appropriate amount by a dispenser, thereby forming the first resin (6) including the mixed phosphor (7) dispersed therein. The obtained chromaticity was x=0.338 and y=0.330, which was substantially white. FIG. 5 shows an emission spectrum of the white light emitting diode of the embodiment 1.

There will be next explained a producing procedure of the bullet type white light emitting diode of this first embodiment. Firstly, the blue light emitting diode element (4) is die bonded by an electroconductive paste onto the element placement depression of one (2) of the paired lead wires, to thereby electrically connect the lead wire to the lower electrode of the blue light emitting diode element and to fix the blue light emitting diode element (4). Next, the upper electrode of the blue light emitting diode element (4) is die bonded to the other of lead wires, thereby electrically connecting them to each other. Previously mixed with each other at a mixing ratio of 5:2 are the first green phosphor powder and the second red phosphor powder, and this mixed phosphor powder is mixed into an epoxy resin at a concentration of 35 wt %. Next, the resultant resin is coated in an appropriate amount onto the depression by a dispenser to cover the blue light emitting diode element, and then cured to form the first resin (6). Finally, the tip end of the lead wire including the depression, the blue light emitting diode element, and the first resin including the phosphors dispersed therein, are wholly encapsulated in the second resin by a casting method. Although the same epoxy resin was used for the first resin and second resin in this embodiment, it is possible to use another resin such as a silicone resin, or a transparent material such as glass. It is desirable to select a material which is low in degradation due to ultraviolet light.

Embodiment 2

Figure 6:
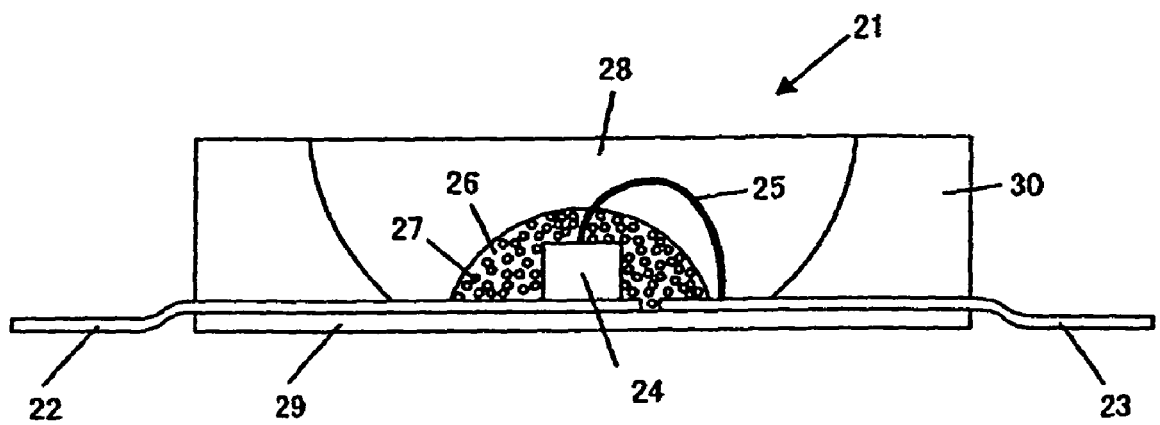
FIG. 6 is a schematic view of a second embodiment mounted as a chip-type light emitting diode lamp.

There was fabricated a chip-type white light emitting diode lamp (21) to be mounted on a substrate. Its configuration is shown in FIG. 6. It included a white alumina ceramic substrate (29) having a higher reflectivity to visible light, and two lead wires (22, 23) fixed thereto, and the lead wires each included one end located at substantially the center position of the substrate, and the other end drawn out to the exterior to form an electrode to be soldered to an electric substrate upon mounting thereto. Placed onto and fixed to the one end of one (22) of the lead wires, was a blue light emitting diode element (24) so as to be located at the central portion of the substrate. The blue light emitting diode element (24) had a lower electrode electrically connected to the lead wire thereunder by an electroconductive paste, and an upper electrode electrically connected to the other lead wire (23) by a thin gold line (25).

Mounted near the light emitting diode element was a resin including a phosphor (27) which was dispersed therein and which was obtained by mixing a first resin and a second phosphor with each other. The first resin (26) including the phosphor dispersed therein was transparent and covered the whole of the blue light emitting diode element (24). Further, fixed on the ceramic substrate was a wall surface member (30) in a shape having a hole at a central portion. As shown in FIG. 6, the wall surface member (30) had its central portion acting as the hole for accommodating therein the blue light emitting diode element (24) and the first resin (26) including the phosphor (27) dispersed therein, and had a portion which was faced to the center and which was formed into an inclined surface. This inclined surface was a reflective surface for forwardly directing light-beams, and had a curved shape to be determined in consideration of the reflected directions of light-beams. Further, at least the surface which constituted the reflective surface, was formed into a surface which was white in color or had metallic luster and which had a higher reflectivity to visible light. In this embodiment, the wall surface member was constituted of a white silicone resin (30). While the hole of the wall surface member at its central portion constitutes a depression as a final shape of the chip-type light emitting diode lamp, the depression is filled with a second transparent resin (28) in a manner to encapsulate all the blue light emitting diode element (24) and the first resin (26) including the phosphor (27) dispersed therein. Adopted as the first resin (26) and second resin (28) in this embodiment was the same epoxy resin. The mixing ratio between the first phosphor and second phosphor, the achieved chromaticity, and the like were substantially the same as those of the first embodiment. The producing procedure was substantially the same as that of the first embodiment, except for a step for fixing the lead wires (22, 23) and the wall surface member (30) to the alumina ceramic substrate (29).

Embodiment 3

Figure 7:
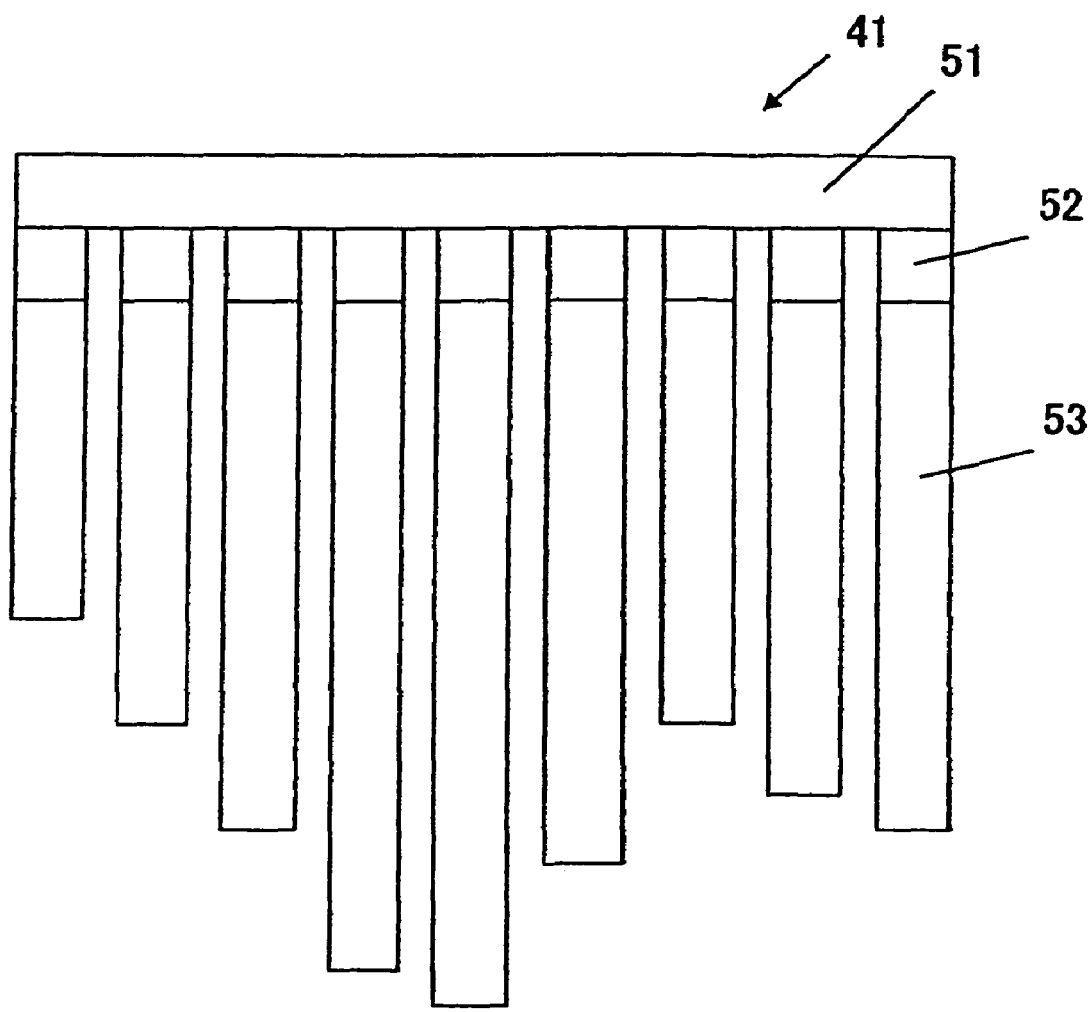
FIG. 7 is a Schematic view of a third embodiment as a highly decorative lighting apparatus including a number of intermediate color light emitting diodes arranged in line to realize light emission in a gradation manner.
Figure 8:
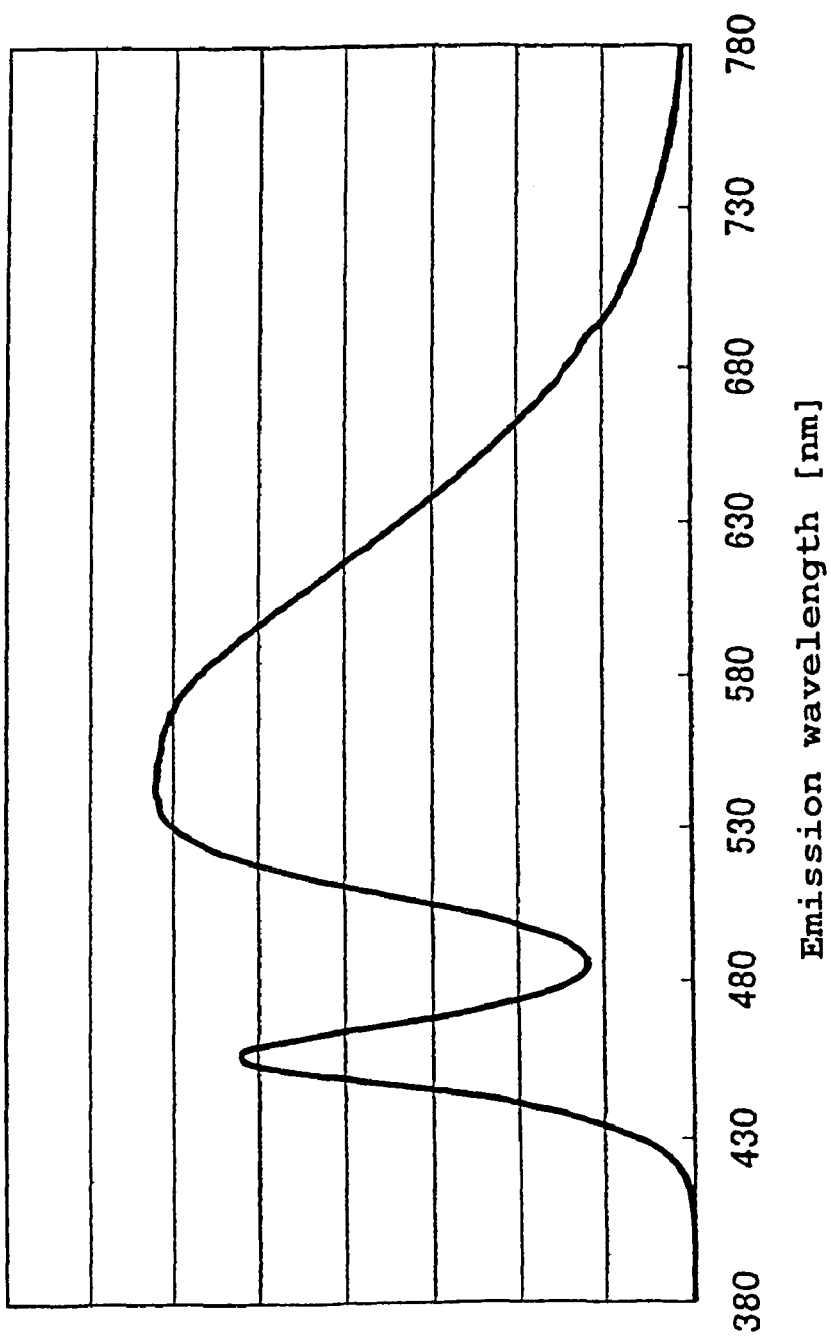
FIG. 8 is a graph of an emission spectrum of that light emitting diode lamp of a first lamp unit of the lighting apparatus of FIG. 7, which has a yellowish white chromaticity.
Figure 9:
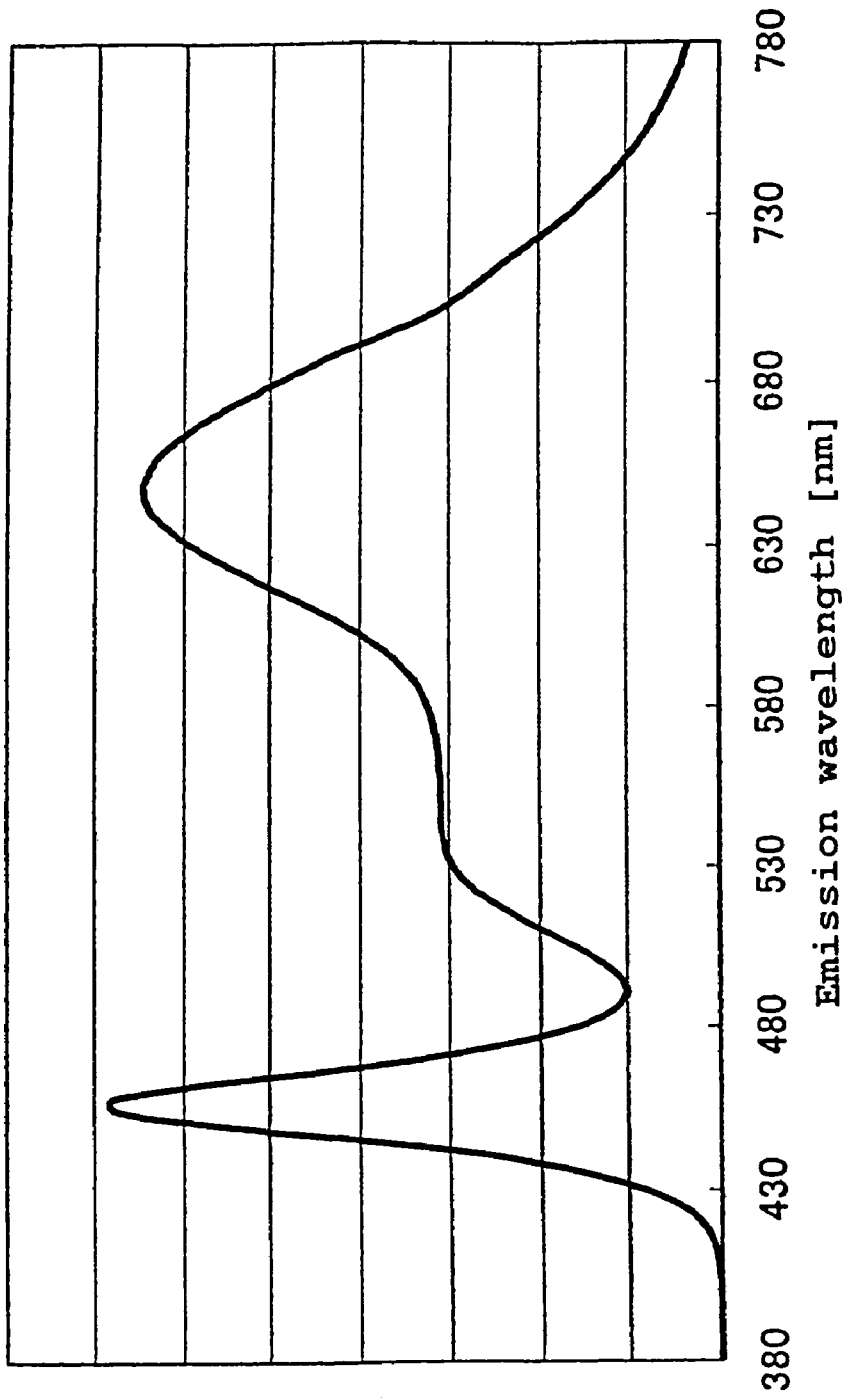
FIG. 9 is a graph of an emission spectrum of that light emitting diode lamp of a ninth lamp unit of the lighting apparatus of FIG. 7, which has a pale pink chromaticity.

There were adopted a number of bullet type light emitting diode lamps of the embodiment 1, to realize a highly decorative lighting apparatus (41) having an emission chromaticity varied in a gradation manner. FIG. 7 is a schematic view thereof. The lighting apparatus includes a laterally elongated upper support body (51), which is to be directly attached to a ceiling of a building or to be suspended therefrom by a chain or the like, thereby supporting the whole of the lighting apparatus (41). Accommodated in the support body (51) is an electric circuit of a light emitting diode lamp driving portion, which is supplied with an electric power from a mains-powered outside AC 100V electric-power source, thereby supplying an appropriate electric current to the light emitting diode lamps. The driving portion is connected to an electric-power source switch not shown and a dimmer dial not shown, thereby enabling the lighting electric-power source to be manually turned ON and OFF and the lighting emission intensity to be adjusted. The support body is connected with a plurality of lamp units (52). This embodiment includes nine units. Installed in each lamp unit are a number of bullet type light emitting diode lamps. In this embodiment, concentrically arranged in each lamp unit are 18 pieces of bullet type light emitting diode lamps. The light emitting diodes were fabricated with varied chromaticities, lamp unit by lamp unit.

Eight light emitting diodes installed in the fifth central lamp unit, each include the first phosphor and the second phosphor mixed at a ratio of 5:2 in a manner to achieve its chromaticity of white of x=0.34 and y=0.33 similarly to the first embodiment and second embodiment. The first lamp unit at one end has a mixing ratio of 12:1 to achieve yellowish white having chromaticity coordinate of x=0.37 and y=0.42. The ninth lamp unit at the other end has a mixing ratio of 4:5 to achieve pale pink having chromaticity coordinates of x=0.38 and y=0.32. The intermediately located second, third, fourth, sixth, seventh, and eighth lamp units, are arranged to have stepwise varied mixing ratios to achieve chromaticities which are varied in a gradation manner, respectively.

In addition to the variation of mixing ratios of the first phosphor and second phosphor, the bullet type light emitting diode lamps were produced to achieve appropriate chromaticities by appropriately adjusting coating amounts upon coating the first resin. Arranged at a lower portion of each lamp unit is a light guiding member (53) including a scattering element, such that light from the associated lamp unit enters the light guiding member. Concretely, there was adopted a columnar member made of transparent resin appropriately including air bubbles therein. In this way, there was achieved a highly decorative lighting apparatus, an aurora being imaged, which adopts intermediate color light emitting diode lamps with a higher luminance.

INDUSTRIAL APPLICABILITY

Recently, there have been rapidly and widely used white light emitting diodes for lighting each utilizing a blue light emitting diode element and phosphors. It is apparent that the present invention can be directly used in this field of art, and it is expected that the present invention is remarkably utilized since the present invention enables white color lighting with warmness at a higher luminance, and enables design of diversified color schemes and chromaticities which have not been conventionally provided, thereby enabling desired intermediate colors to be created.

The invention claimed is:

1. A bullet type light emitting diode lamp or a chip-type light emitting diode lamp to be mounted on a substrate, comprising: a semiconductor light emitting element, and a plurality of fluorescent materials that absorb part or whole of light emitted from the semiconductor light emitting element, and emit fluorescence at a wavelength different from that of the absorbed light, wherein the plurality of fluorescent materials comprise a phosphor composed of a $CaAlSiN_3$ crystalline phase.

2. The bullet type light emitting diode lamp or the chip-type light emitting diode lamp to be mounted on a substrate according to claim 1, wherein the phosphor has a main emission wavelength of 585 nm to 780 nm, and emits light in a range of "red" by a general chromaticity classification, according to system color names of JIS Z8110.

3. The bullet type light emitting diode lamp or the chip-type light emitting diode lamp to be mounted on a substrate according to claim 1, wherein the bullet type light emitting diode lamp or the chip-type light emitting diode lamp to be mounted on a substrate emits light in a color of a chromaticity coordinate of x=0.34 to 0.38 and y=0.32 to 0.42 in a chromaticity diagram (CIE) of an XYZ colorimetric system according to JIS Z8701.

4. A visible light emitting device, comprising:
a semiconductor light emitting element that emits bluish purple or blue light,
a support member for placing the semiconductor light emitting element therein,
a terminal for supplying electric power to the semiconductor light emitting element, and
a fluorescent material that absorbs part or whole of light emitted from the semiconductor light emitting element, and emits fluorescence at a wavelength different from that of the absorbed light, wherein the fluorescent material comprises a phosphor of a $CaAlSiN_3$ crystalline phase that is obtained by firing using an electric furnace of a resistance heating type.

5. The light emitting device according to claim 4, wherein the phosphor of the $CaAlSiN_3$ crystalline phase is obtained by heating after firing atmosphere is made vacuum.

6. The light emitting device according to claim 4, wherein the phosphor of the $CaAlSiN_3$ crystalline phase is obtained by firing using a crucible made of boron nitride.

7. The light emitting device according to claim 4, wherein the phosphor of the $CaAlSiN_3$ crystalline phase is obtained by pulverizing after firing in nitride atmosphere.

8. The light emitting device according to claim 4, wherein the phosphor of the $CaAlSiN_3$ crystalline phase has a main emission wavelength of 585 nm to 780 nm, and emits light in a range of "red" by a general chromaticity classification, according to system color names of JIS Z8110.

9. The light emitting device according to claim 4, wherein the fluorescent material is essentially the $CaAlSiN_3$ crystalline.

10. The light emitting device according to claim 4, further comprising a plurality of further bullet type light emitting diode lamps or chip-type light emitting diode lamps, wherein the respective plurality of fluorescent materials comprises $CaAlSiN_3$ crystalline phase and a second phosphor, the $CaAlSiN_3$ crystalline phase and the second phosphor being mixed in respectively different ratios so as to respectively produce different color light when irradiated by the respective semiconductor light emitting element.

11. The visible light emitting device according to claim 4, in combination with a plurality of further visible light emitting devices, each of the plurality of further visible light emitting devices comprising a fluorescent material comprising $CaAlSiN_3$ crystalline phase and a second phosphor, the $CaAlSiN_3$ crystalline phase and the second phosphor being mixed in respectively different ratios so as to respectively produce different color light when irradiated by the respective semiconductor light emitting element.

* * * * *